US007422345B2

(12) United States Patent
Lin

(10) Patent No.: US 7,422,345 B2
(45) Date of Patent: Sep. 9, 2008

(54) REFLECTOR DEVICE AND METHOD OF MANUFACTURING SAME

(76) Inventor: Yuan Lin, 5 Viewmont Court, Doncaster East, 3109 VIC. (AU)

( * ) Notice: Subject to any disclaimer, the term of this patent is extended or adjusted under 35 U.S.C. 154(b) by 345 days.

(21) Appl. No.: 10/971,054

(22) Filed: Oct. 25, 2004

(65) Prior Publication Data

US 2005/0117356 A1    Jun. 2, 2005

(30) Foreign Application Priority Data

Dec. 2, 2003    (TW) ............................... 92133911 A

(51) Int. Cl.
*G02B 5/12* (2006.01)
(52) U.S. Cl. ....................... 362/249; 359/516
(58) Field of Classification Search ................. 439/110, 439/211; 359/516; 349/84
See application file for complete search history.

(56) References Cited

U.S. PATENT DOCUMENTS 3,892,225 A * 7/1975 Twose ........................ 126/204
4,143,931 A * 3/1979 Skare et al. .................... 439/67
5,310,355 A * 5/1994 Dannatt ....................... 439/110
6,059,414 A * 5/2000 Tsai ............................ 359/516
6,307,605 B1* 10/2001 Bailey ......................... 349/84
6,914,194 B2* 7/2005 Fan .......................... 174/117 F

FOREIGN PATENT DOCUMENTS

TW    355642    4/1999
TW    383121    2/2000

* cited by examiner

*Primary Examiner*—Anabel M Ton

(57) ABSTRACT

Disclosed is a reflector devise and method manufacturing same. The reflector device comprises a lamp unit comprising a seat assembly, a rivet assembly in the seat assembly, the rivet assembly including rivets projected from an underside of the seat assembly, and a LED lamp in the seat assembly, the LED lamp being electrically coupled to the rivet assembly; and a belt unit comprising an insulating layer and a conductive layer sealed by the insulating layer. The conductive layer comprises conductors and the insulating layer comprises sets of holes along the conductive layer so that the rivets are adapted to pass through the holes into the conductive layer to fasten and electrically connect the lamp and the belt units together. The invention has advantages of mass production and being waterproof and airtight.

26 Claims, 15 Drawing Sheets

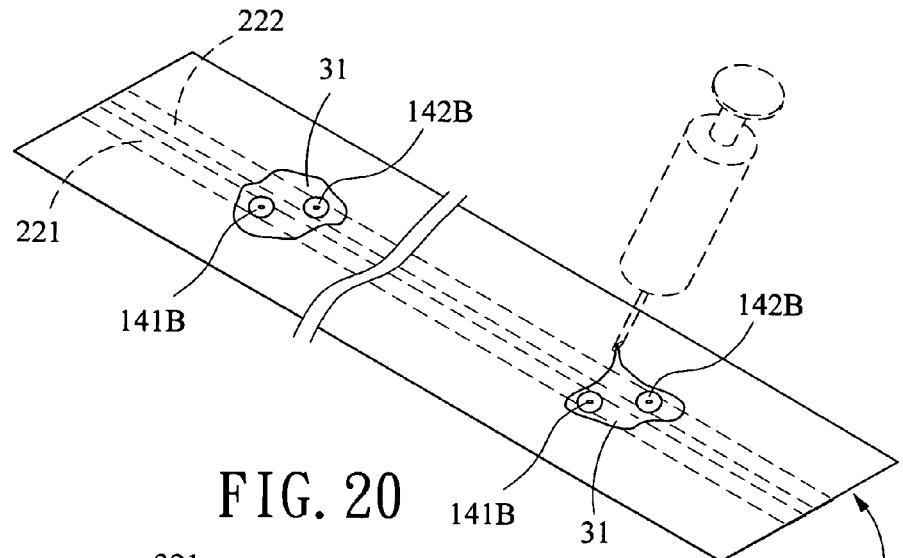
FIG. 20
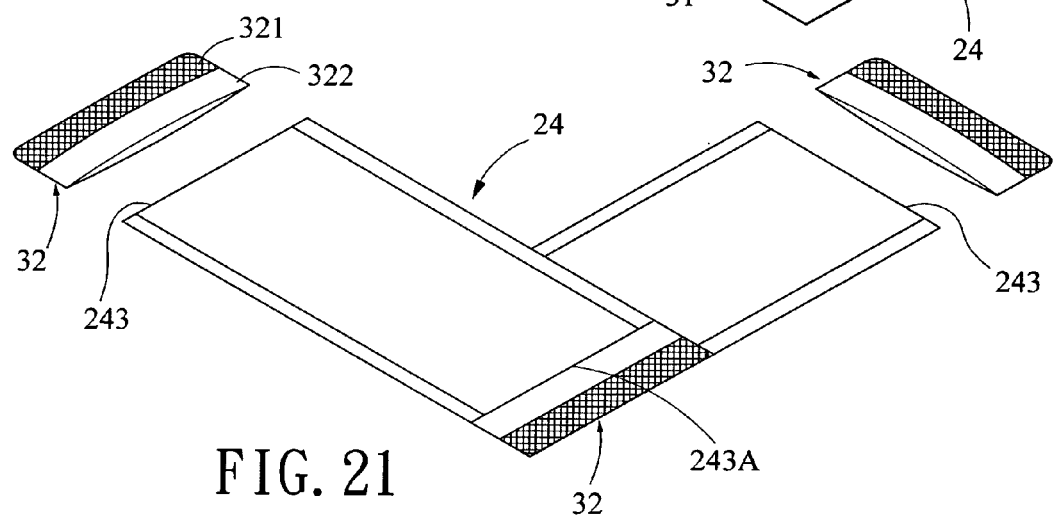
FIG. 21
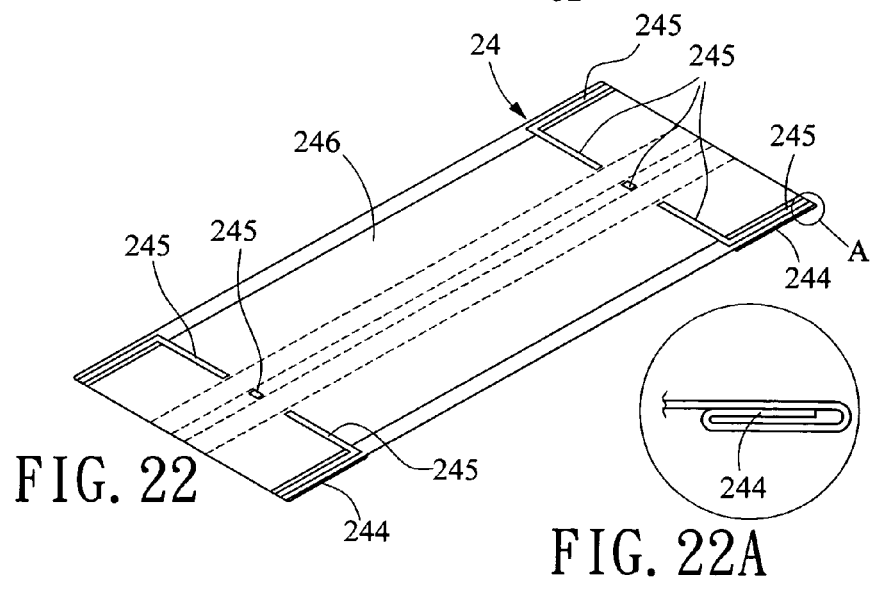
FIG. 22
FIG. 22A

REFLECTOR DEVICE AND METHOD OF MANUFACTURING SAME

BACKGROUND OF THE INVENTION

1. Field of the Invention

The present invention relates to reflector devices and more particularly to a modularized reflector device having advantages of being ease of mass production and being waterproof and airtight, and method of manufacturing same.

2. Description of Related Art

A prior reflector belt (or reflector device) comprises a plurality of illuminators electrically coupled together by wires, a switch, a power supply, a flash controller all coupled to the illuminators, and a reflective strip (or waterproof belt) for enclosing the above components. The reflector belt is typically stitched to a clothes or the like. Such design has been disclosed in Taiwanese Patent Published Nos. 355,642 and 383,121. However, it is impossible of manufacturing the prior art in a modularized, mass production since the coupling, wiring and checking of illuminators, wires, power switch, power supply and other electrical components and the stitching process are tedious and much time consuming. Hence, the prior art finds it hard of putting into practice in industry. Moreover, in practice spacing between any two illuminators have to be well adjusted in order to exactly adapt to the article (e.g., shoulder belt or waist belt of a clothes) that the prior art is attached to. Thus, the upstream manufacturer has to prepare many sets of illuminators having different spacings and belts of different lengths for fulfilling different needs of her downstream customers. This inevitably will increase the manufacturing cost and lower the production. Also, an additional waterproof treatment has to be done on the prior reflector belt. This further complicates the manufacturing process. To the worse one such reflector belt having a poor waterproof or airtight capability may cause danger (e.g., spark or explosion caused by exposing wires, flash controller, and illuminators to air having gas or other inflammable articles) when it is used in an environment requiring a highly safe operating standard. Thus, the need for improvement still exists.

SUMMARY OF THE INVENTION

It is an object of the present invention to provide a reflector belt and method of manufacturing same wherein advantages of being ease of mass production and reduced much manufacturing cost are attained for upstream manufacturer due to the provision of modular components.

It is another object of the present invention to provide a reflector belt and method of manufacturing same wherein no additional equipment and no additional stock material and components are required in the manufacturing process due to the provision of modular components and thus D.I.Y manufacturing and saving manufacturing cost are readily accomplished in downstream manufacturer.

It is further object of the present invention to provide a reflector belt and method of manufacturing same wherein each reflector device is provided with waterproof and airtight for enabling the reflector device to employ in an environment requiring a highly safe operating standard.

To achieve the above and other objects, the present invention provides a reflector device, comprising a lamp unit comprising a seat assembly, a rivet assembly in the seat assembly, the rivet assembly including a plurality of rivets projected from an underside of the seat assembly, and a LED lamp in the seat assembly, the LED lamp being electrically coupled to the rivet assembly; and a belt unit comprising an insulating layer and a conductive layer sealed by the insulating layer, wherein the conductive layer comprises a plurality of conductors and the insulating layer comprises a plurality of sets of holes along the conductive layer so that the rivets are adapted to pass through the holes into the conductive layer to fasten and electrically connect the lamp and the belt units together.

The present invention also provides a method of manufacturing a reflector device, comprising placing a punching machine in a belt unit, punching at least one set of holes on the belt unit, placing a lamp unit on the belt unit, inserting two or more rivets in the holes to electrically connect to two or more metal conductors in the belt unit, and flattening the shanks of the rivets projected from the belt unit to form two or more rivet fastening surfaces so as to fasten and electrically connect to the lamp unit.

The above and other objects, features and advantages of the present invention will become apparent from the following detailed description taken with the accompanying drawings.

BRIEF DESCRIPTION OF THE DRAWINGS

FIG. 20 is a view similar to FIG. 17, the reflective conductive belt being shown during adhesive coating;

FIG. 21 is a view schematically showing a mounting of waterproof sheaths to ends of a reflective conductive belt in a waterproof process according to the invention;

FIG. 22 is a view schematically showing a folding of the ends of the reflective conductive belt in the waterproof process by heating according to the invention;

FIG. 22A is a detailed view of the area in circle A of FIG. 22;

DETAILED DESCRIPTION OF THE PREFERRED EMBODIMENTS

Figure 1:
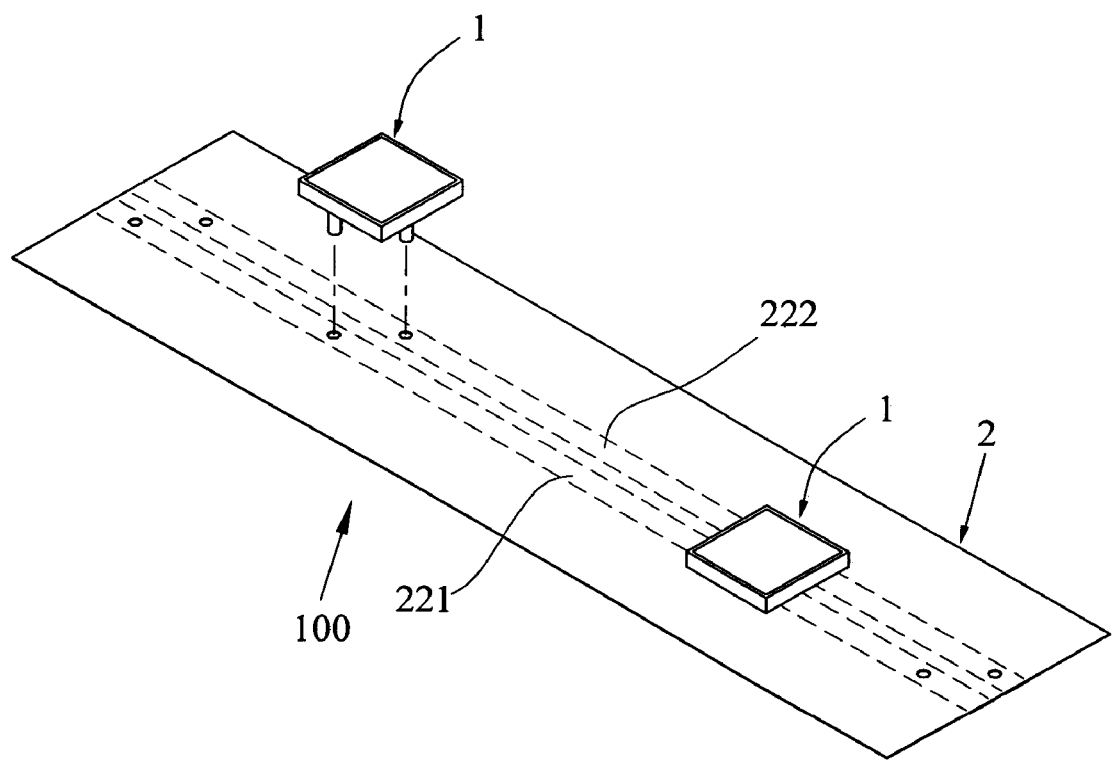
FIG. 1 is an exploded, perspective view of a portion of a reflector device according to the invention.

Referring to FIG. 1, there is shown a reflector device constructed in accordance with the invention. The reflector device comprises a belt unit 2 and a lamp unit 1 secured onto the belt unit 2 so as to form a reflector device 100. The reflector device 100 has the advantages of being waterproof, airtight, and used as warning means. The reflector device 100 finds an application of stitching to clothes, mounting to a warning device, or the like. Each component of the lamp unit 1 and the belt unit 2 will be described in detail below.

Figure 2:
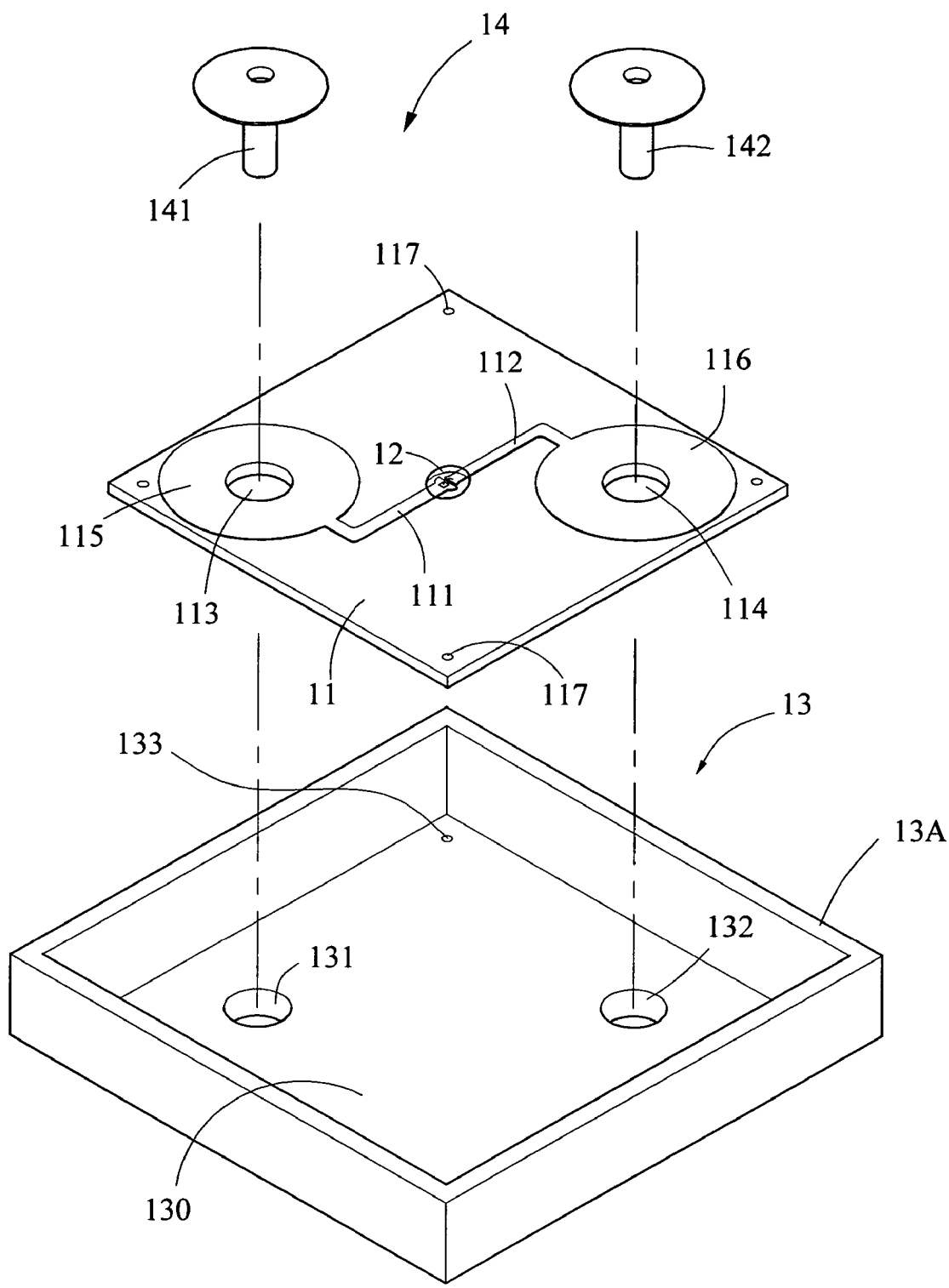
FIG. 2 is an exploded view of a lamp unit of the reflector device.
Figure 3:
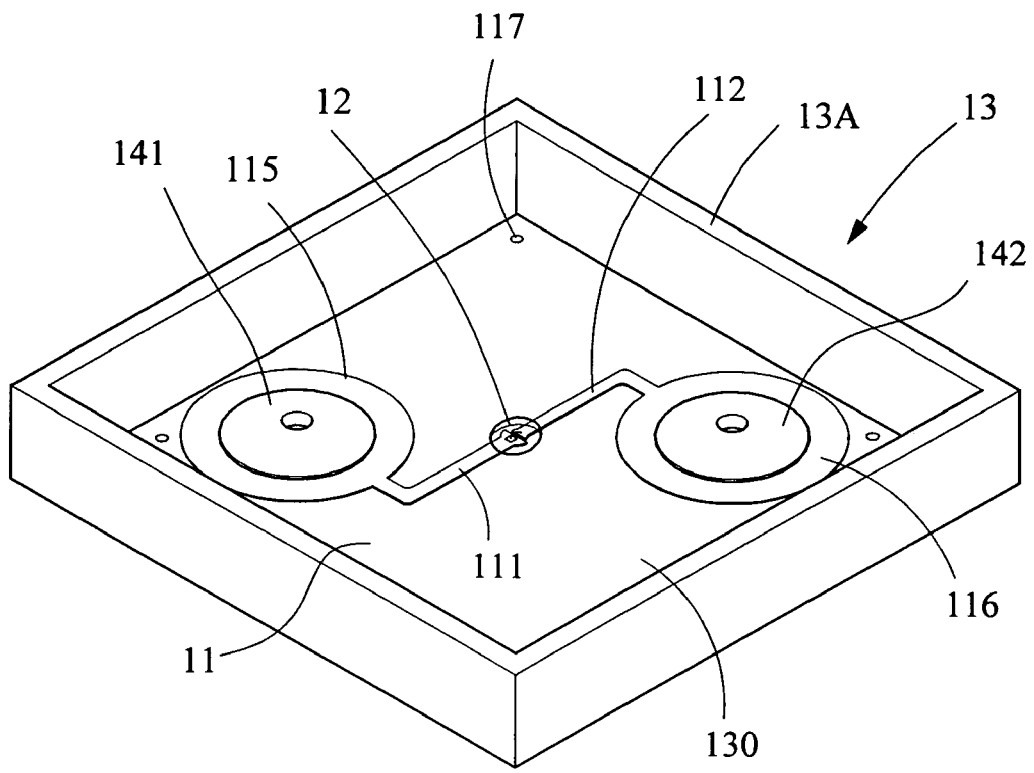
FIG. 3 is a perspective view of FIG. 2.
Figure 4:
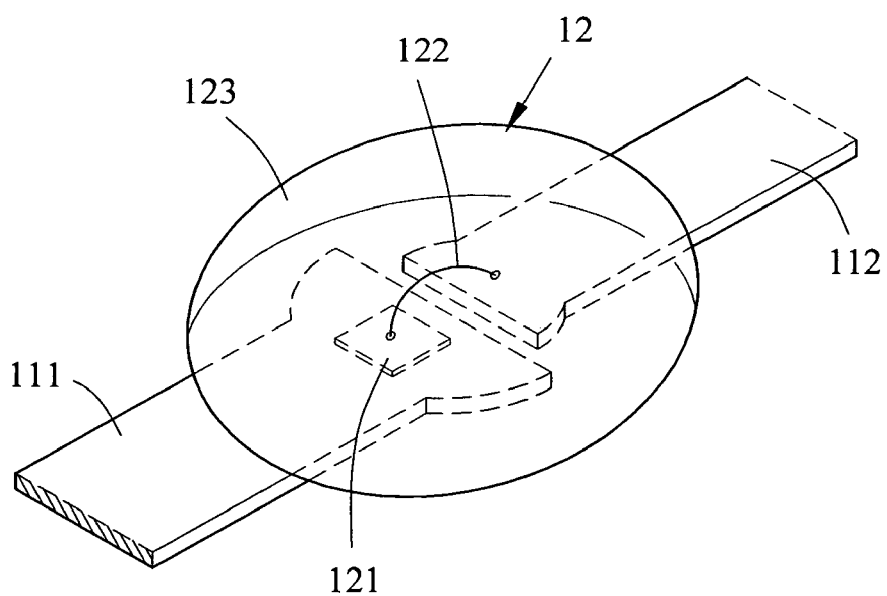
FIG. 4 is a perspective view of a LED lamp of the lamp unit according to a first preferred embodiment of the invention.

Referring to FIGS. 2 to 4, the lamp unit 1 comprises a base 11, a LED (light-emitting diode) lamp 12, a seat assembly 13, and two or more rivets including rivets 141 and 142. The base 11 comprises two electric wires 111, 112 and two apertures 113, 114. A contact 115 is provided at the aperture 113 and another contact 116 is provided at the aperture 114 so as to electrically couple to the wires 111 and 112 respectively as a portion of the electrical connection of the lamp unit 1. A plurality of holes 117 are provided at corners of the base 11 as means of bond injection or ventilation. The LED lamp 12 is provided at a connecting point of the wires 111 and 112 and comprises a LED die 121 on the wire 111 and a lead 122 coupled between the LED die 121 and the wire 112. The LED lamp 12 is enclosed by an encapsulation 123 (e.g., epoxy) to form a COB (chip on board) based LED.

The seat assembly 13 comprises a rectangular support 13A having four side walls for forming a space 130 to receive the base 11. The seat assembly 13 further comprises two spaced apertures 131, 132 and a plurality of holes 133 adjacent the corners. The holes 133 are aligned with the holes 117 as means of bond injection or ventilation. The rivets 141 and 142 are inserted through the apertures 113, 114 and the apertures 131, 132 to fasten on the contacts 115 and 116 by soldering. As such, the base 11 is fastened within the support 13A.

Figure 5:
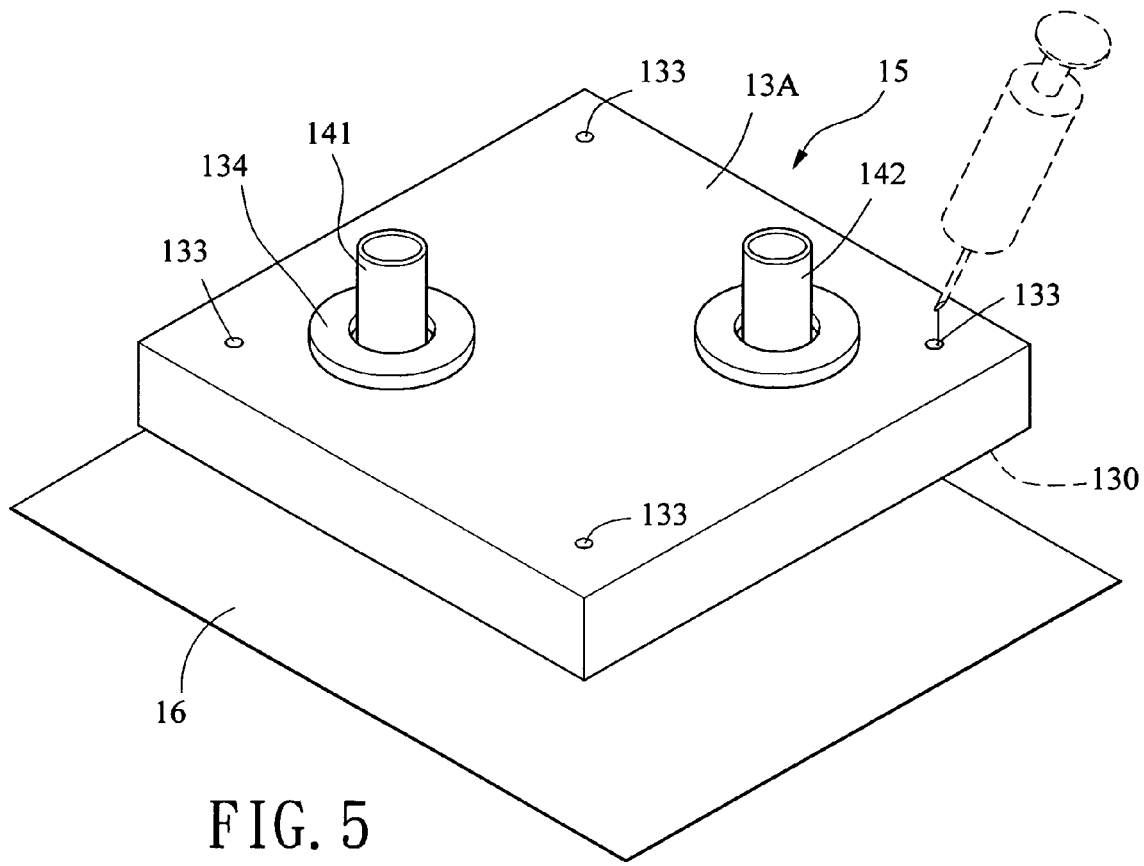
FIG. 5 is a perspective view illustrating a process of injecting bond into the lamp unit.
Figure 6:
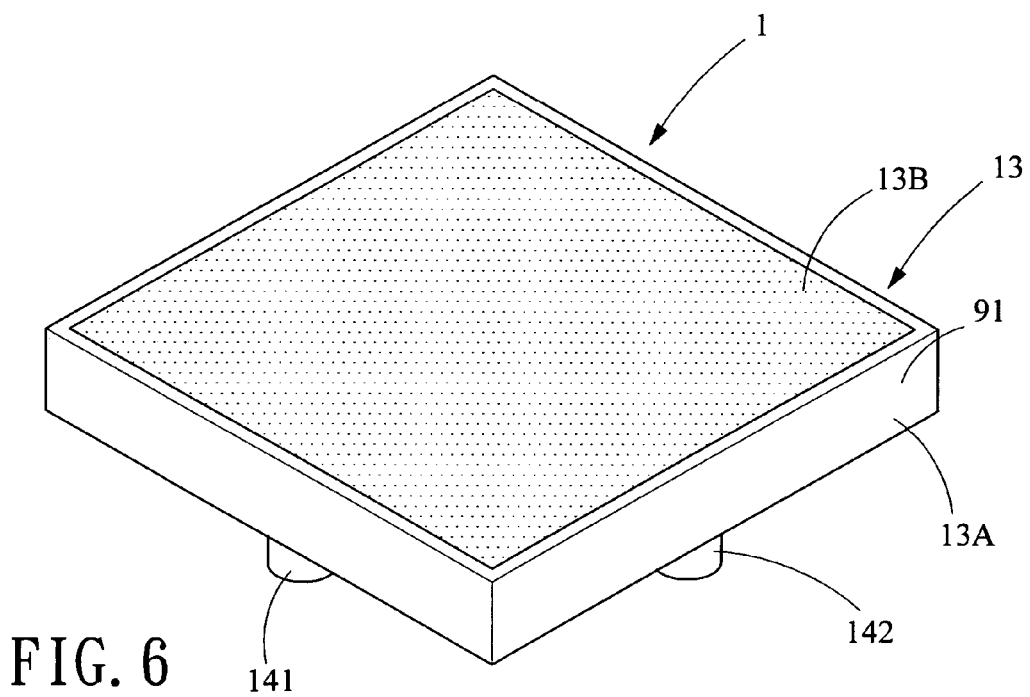
FIG. 6 is a perspective view of the lamp unit after finishing the bond injection.

Referring to FIGS. 5 and 6, a waterproof ring 134 is provided at the underside of the support 13A and is tightly put on the passed shank of either rivet 141 or 142. As such, waterproof and airtight capabilities of the reflector device can be obtained. Also, a film 16 is adhered on the surface of the space 130. Next, a process of bond (e.g., epoxy) injection is performed at the holes 133 to fill bond in the space 130 to enclose the base 11 and the LED lamp 12 and form an encapsulation 13B of the seat assembly 13, as shown in FIG. 6. Thus, a support assembly 15 is formed. The support assembly 15 is then sent to an oven to bake. After baking, the film 16 can be removed to form a lamp unit 1 having exposed rivets 141 and 142.

Figure 7:
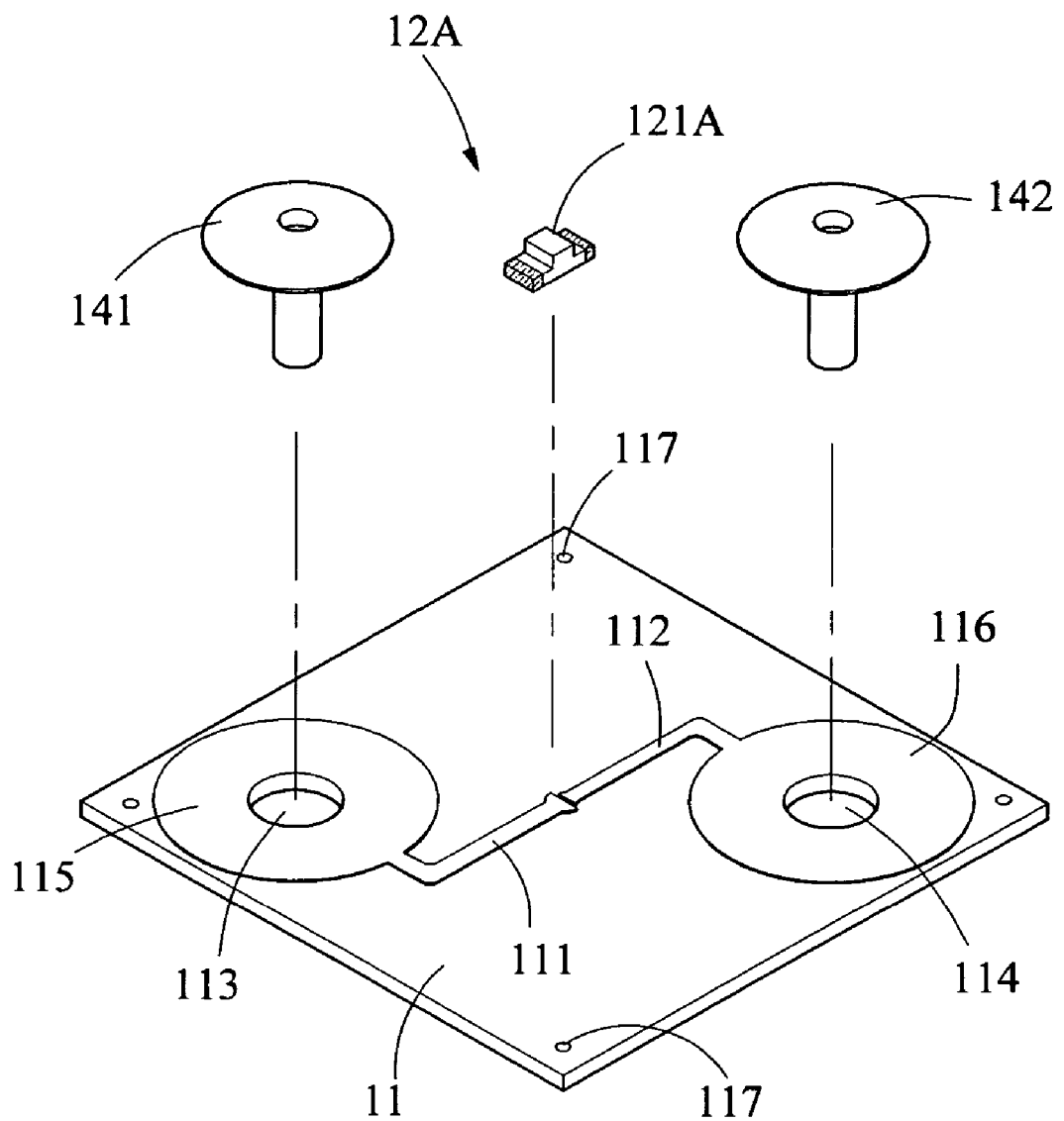
FIG. 7 is a perspective view of a LED lamp according to a second preferred embodiment of the invention, where the rivets and the LED lamp are to be mounted on the base.
Figure 8:
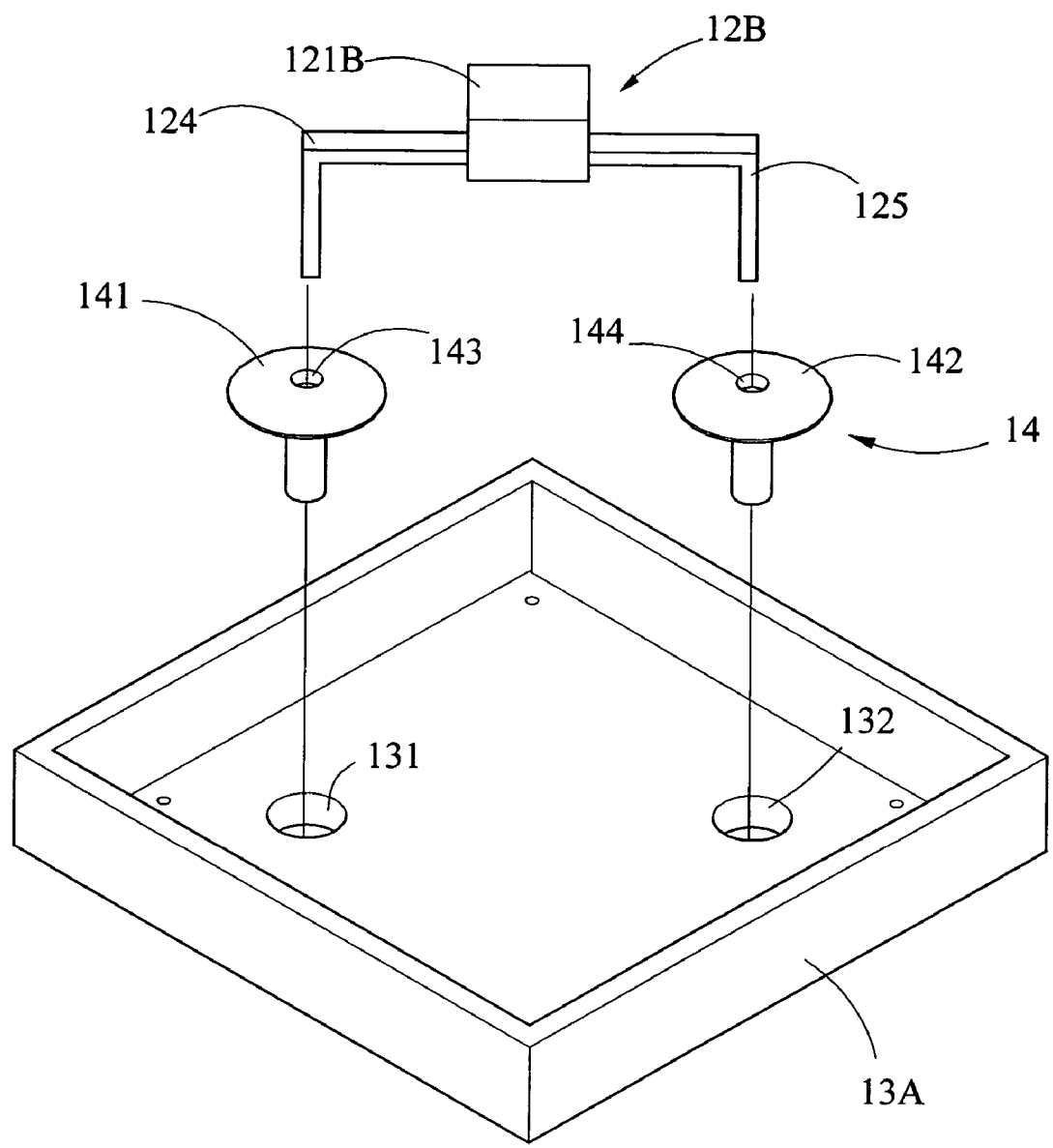
FIG. 8 is a perspective view of a LED lamp according to a third preferred embodiment of the invention, where the rivets and the LED lamp are to be mounted on the support.

Referring to FIG. 7, a second preferred embodiment of the LED lamp 12A is shown. The LED lamp 12A comprises a LED die 121A which is formed at a connecting point of the wires 111 and 112 by SMD (surface mounting) (i.e., SMD based LED). Referring to FIG. 8, a third preferred embodiment of the LED lamp 12B is shown. The LED lamp 12B comprises two leads 124, 125 and a LED lamp 121B at a connecting point of the leads 124 and 125 (i.e., lead frame based LED is formed). Bent portions of the leads 124, 125 are inserted into apertures 143, 144 of the rivets 141 and 142 respectively. Finally, they are secured to the rivets 141 and 142 by soldering.

Figure 9:
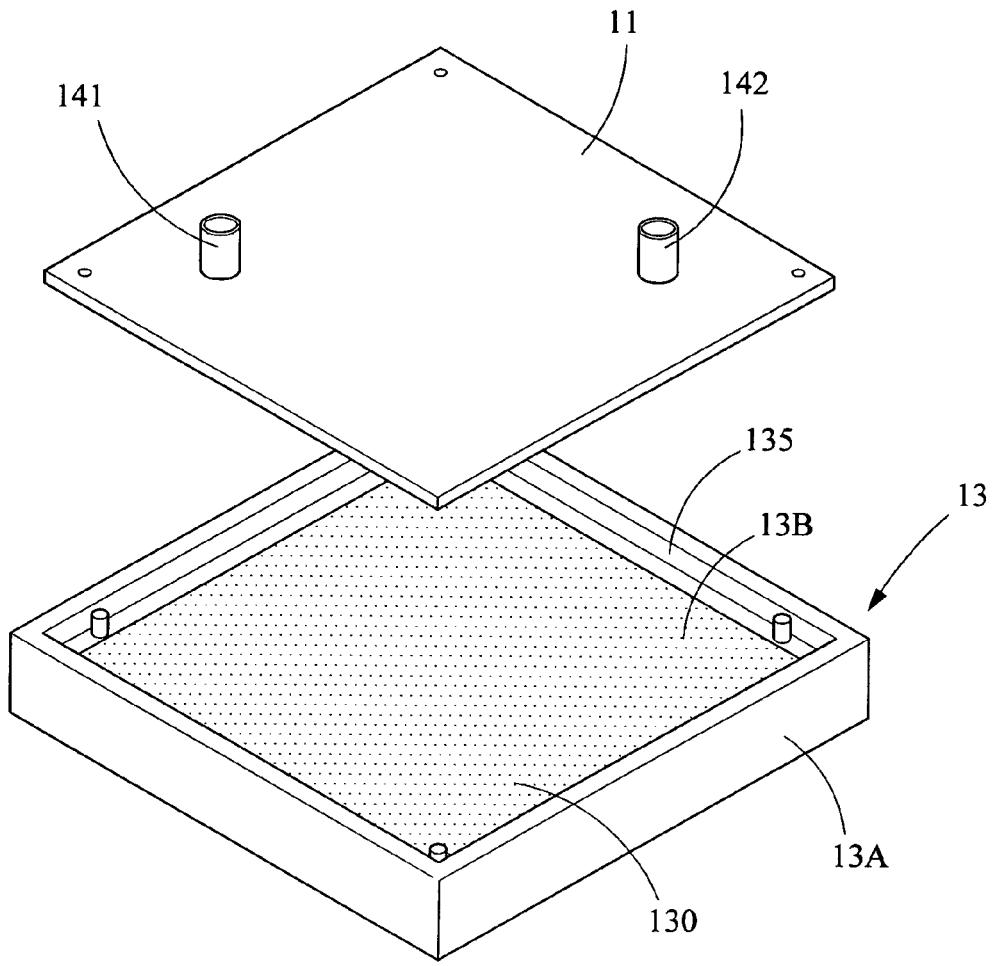
FIG. 9 is an exploded view of a seat assembly according to a second preferred embodiment of the invention.
Figure 10:
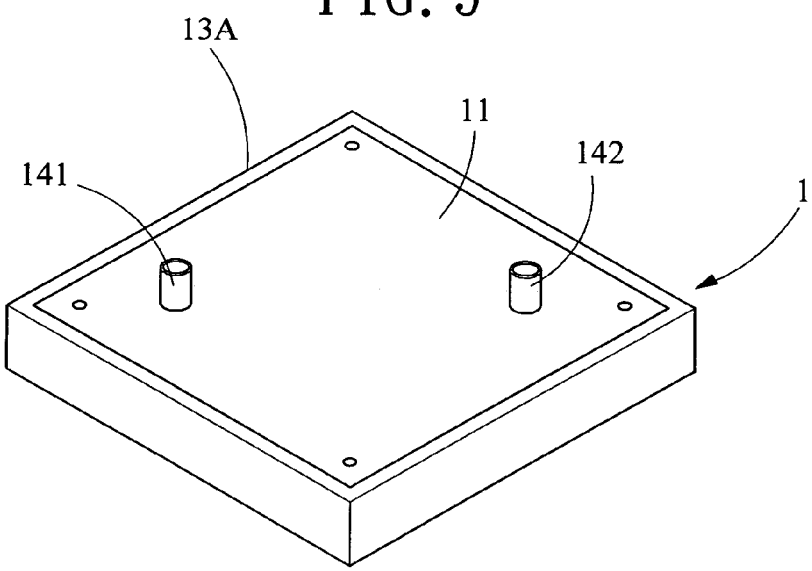
FIG. 10 is a perspective view of the assembled seat assembly of FIG. 9.

Referring to FIGS. 9 and 10, the seat assembly 13 according to a second preferred embodiment of the invention is shown. As stated above, the LED lamp 12 and the rivets 141 and 142 are formed on the base 11. Next, fill bond in the space 130 to form an encapsulation 13B within the support 13A. Also, the rivets 141 and 142 are exposed from the underside of the seat assembly 13. Finally, the lamp unit 1 is formed after baking. Moreover, a peripheral groove 135 is formed around inner surfaces of the walls of the support 13A for facilitating a fitting of the base 11 onto the support 13A (i.e., onto the groove 135) and adhesion thereafter.

Figure 11:
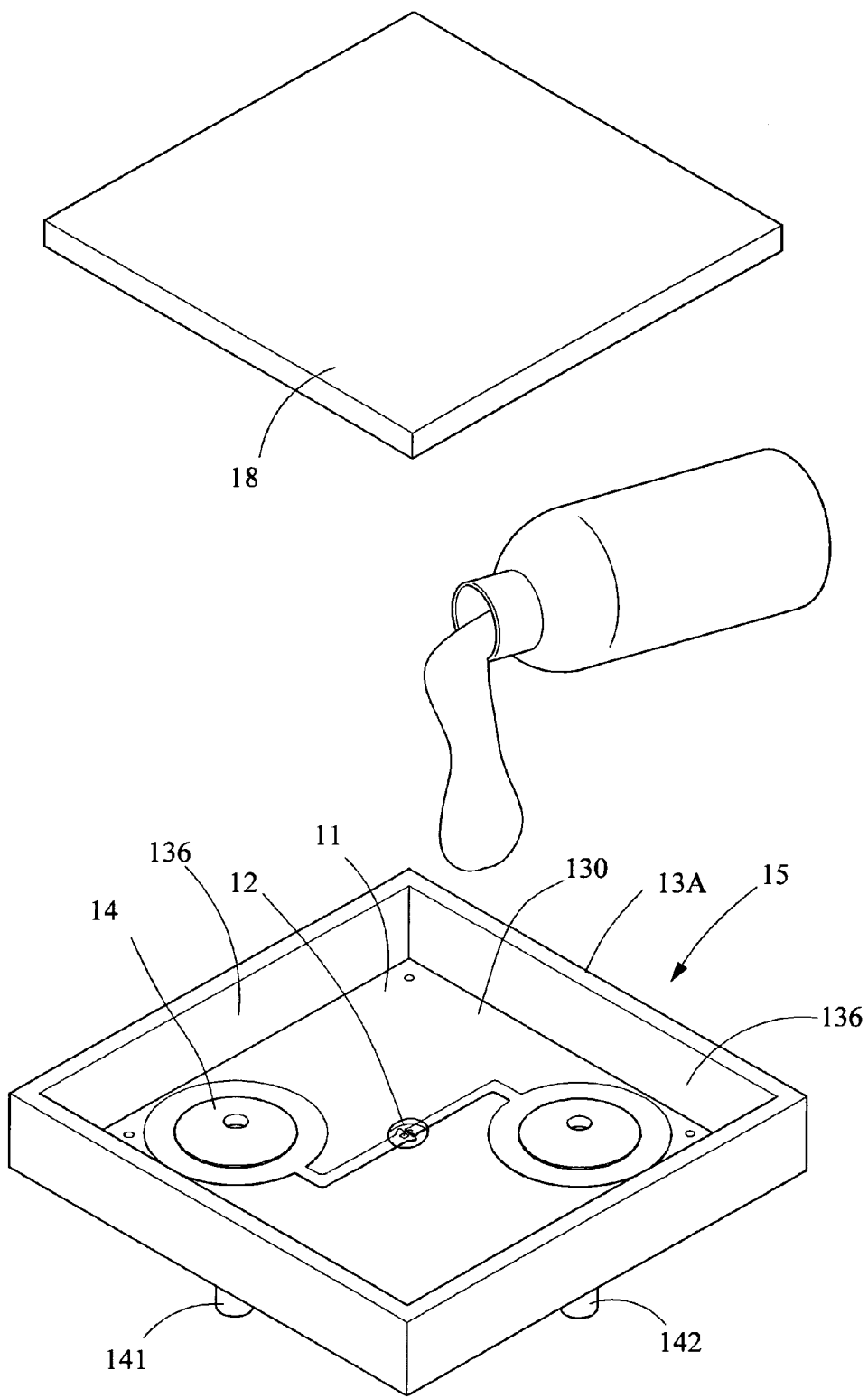
FIG. 11 is an exploded view of a lamp unit according to a third preferred embodiment of the invention, where a bond injection is being performed.
Figure 12:
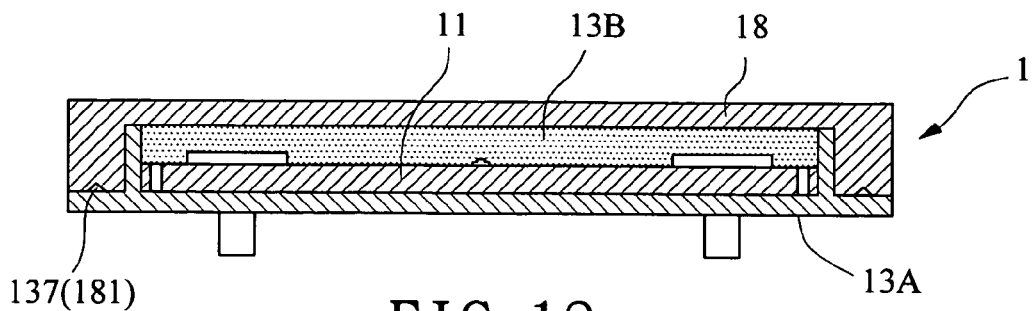
FIG. 12 is a cross-sectional view of the formed lamp unit of FIG. 11.

Referring to FIGS. 11 and 12, a third preferred embodiment of the seat assembly 13 (or lamp unit 1) is shown. The base 11, the LED lamp 12, and the rivets 141 and 142 are mounted in the support 13A. Next, fill bond in the space 130 to form an encapsulation 13B therein. Next, a second base 18 is placed on the support 13A and the encapsulation 13B to form a layered structure. Next, use a high-frequency or ultrasonic welder to fasten the second base 18 and the support 13A together with the rivets 141 and 142 exposed from the underside. This forms a lamp unit 1. Moreover, a peripheral ridge 137 is formed around exterior of the walls of the support 13A for facilitating a fitting of a peripheral trough 181 of the cap-like second base 18 onto the support 13A and the encapsulation 13B (i.e., fastened at the ridge 137) and adhesion thereafter.

A number of different assemblies of the invention are contemplated. For example, after mounting the LED lamp 12 and the rivets 14 in the base 11, the base 11 can be placed in a mold for injection molding. As a result, a lamp unit 1 having a single encapsulation 13B on the base 11 is formed. Alternatively, mount the LED lamp 12 and the rivets 141 and 142 in the support 13A. Next, form the encapsulation 13B or place the second base 18 on the support 13A prior to fastening. Positioning legs can also be formed on the second base 18 if desired. Further, the rivets 141 and 142 can be exposed from the support 13A, the base 11, the encapsulation 13B or the second base 18. The forming can be carried out by bond injection based encapsulation, plate based bond injection and encapsulation if the plate is the base 11 or second base 18, plate based heating and encapsulation (e.g., by means of a high-frequency or ultrasonic welder), or injection molding based encapsulation.

Figure 13:
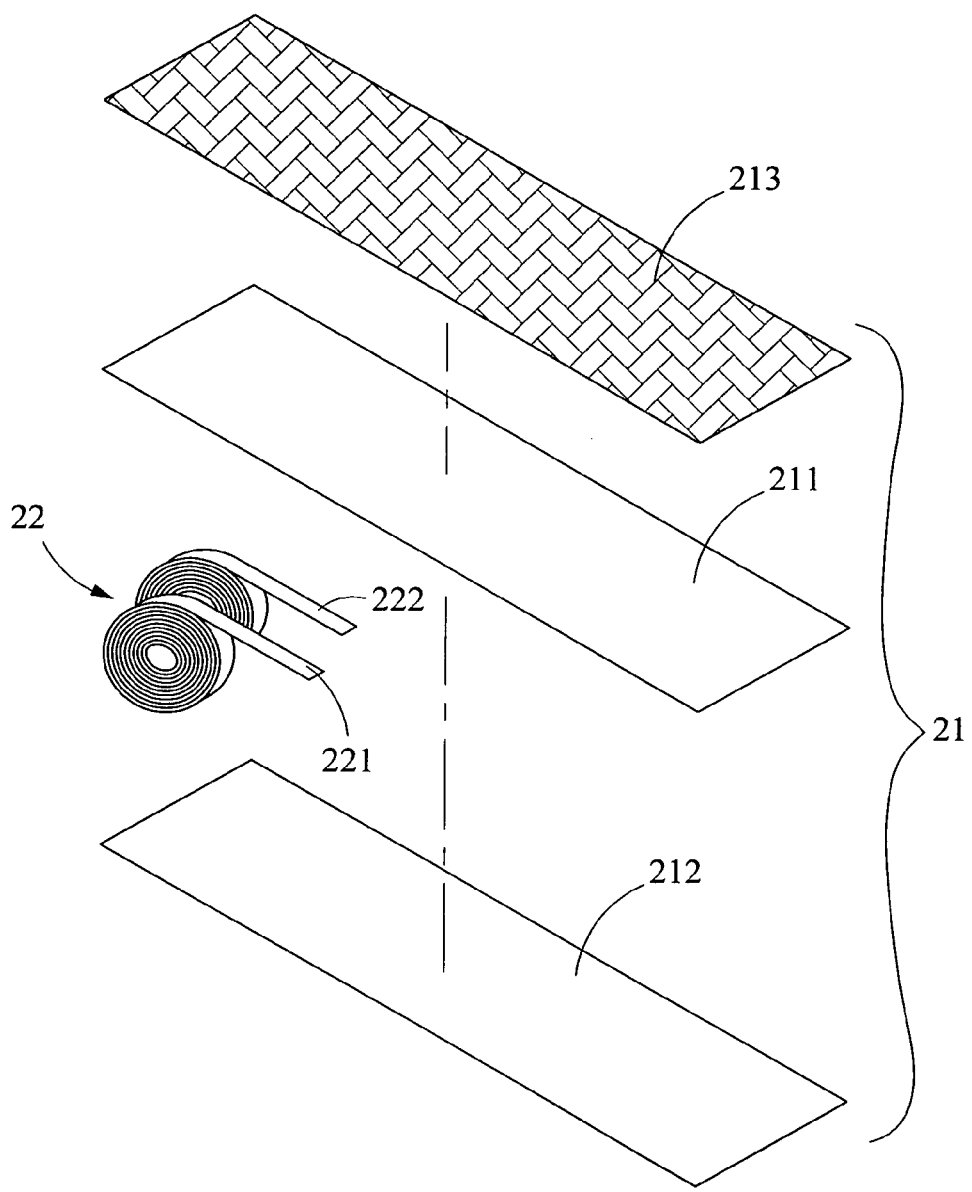
FIG. 13 is an exploded view of a belt unit according to the invention.
Figure 14:
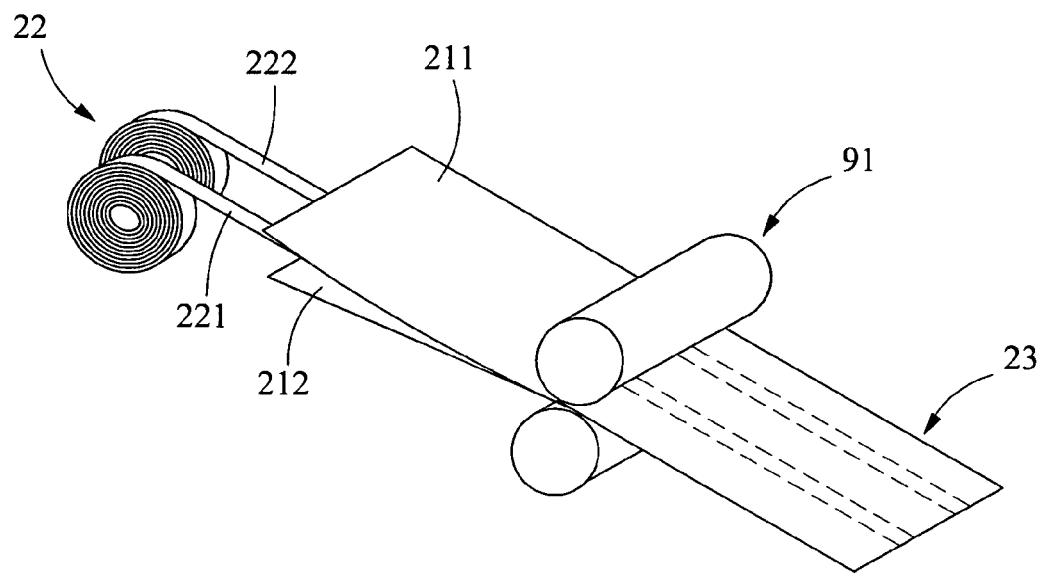
FIG. 14 is a view schematically showing a process of forming a conductive belt according to the invention.
Figure 15:
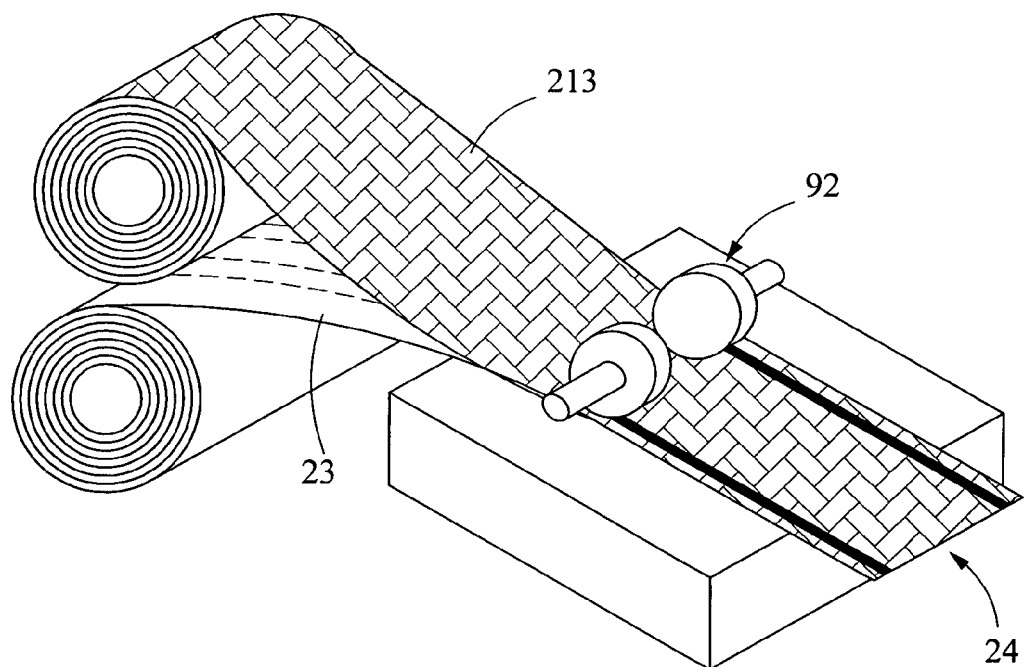
FIG. 15 is a view schematically showing a process of forming the belt unit according to the invention.

Referring to FIGS. 13 to 15 in conjunction with FIG. 1, the belt unit 2 comprises an insulative layer 21 including a transparent PVC (polyvinyl chloride) film 211, a PVC base belt 212, and a PVC reflective belt 213, and a conductive layer 22 including two rolls of metal (e.g., copper, aluminum or steel) conductors 221, 222. The metal conductors 221, 222 are rolled out to place between the PVC film 211 and the PVC base belt 212. Next, a pressing machine 91 is used to press them together to form a conductive belt 23. Further, the reflective belt 213 is fastened onto the conductive belt 23 by means of a high-frequency or ultrasonic welder 92. As an end, a reflective conductive belt 24 is formed. In such a manner, the conductive belt 23 and the reflective conductive belt 24 can be manufactured in a mass production. As to the reflective conductive belt 24, it can be cut into a plurality of belt units 2 having a predetermined length depending on applications.

A process of manufacturing the belt unit 2 comprises (a) placing the metal conductors 221, 222 between the PVC film 211 and the PVC base belt 212; (b) activating a pressing machine 91 to press them together to form a conductive belt 23; (c) fastening the reflective belt 213 onto the conductive belt 23 by means of a high-frequency or ultrasonic welder 92 to form a reflective conductive belt 24; and (d) cutting the reflective conductive belt 24 into a plurality of belt units 2 having a predetermined length depending on applications. In addition, an adhesive can be coated on the conductive belt 23. Next, a laminating machine is used to adhere a reflective belt (e.g., one available from 3M Inc.) on the conductive belt 23 to form a reflective conductive belt 24.

Figure 16:
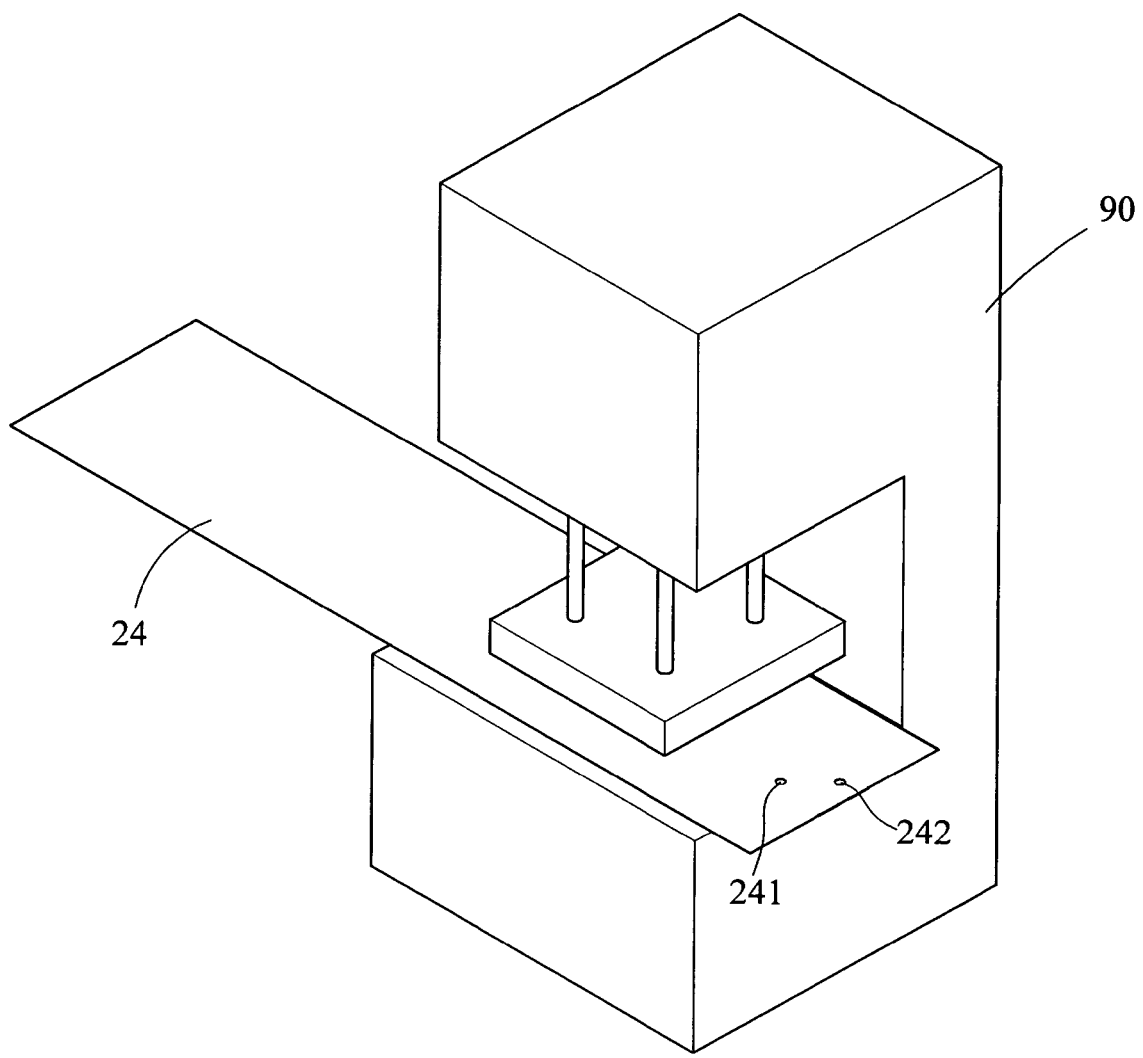
FIG. 16 is a view schematically showing a process of punching holes on the belt unit.
Figure 17:
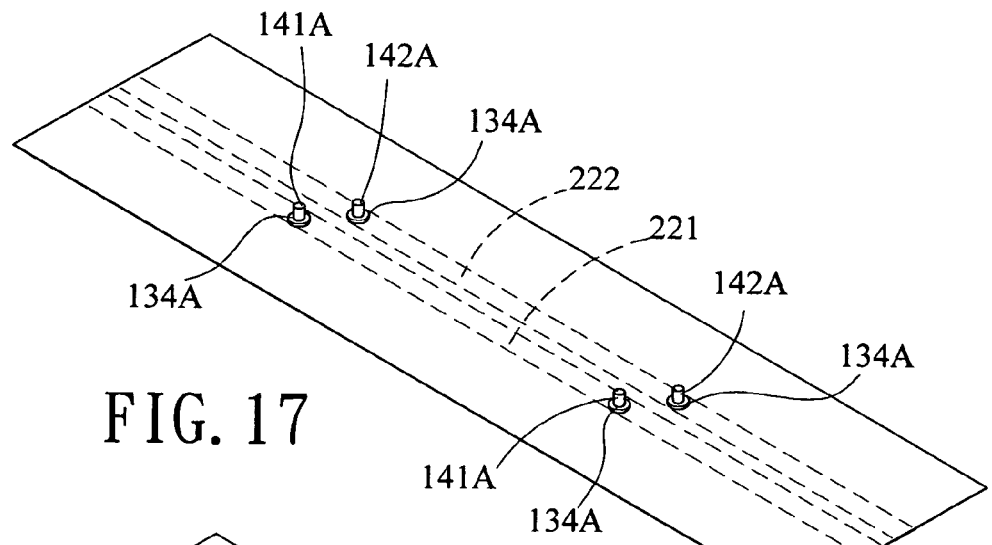
FIG. 17 is a perspective view of the reflective conductive belt, the reflective conductive belt being shown during rivet mounting.
Figure 18:
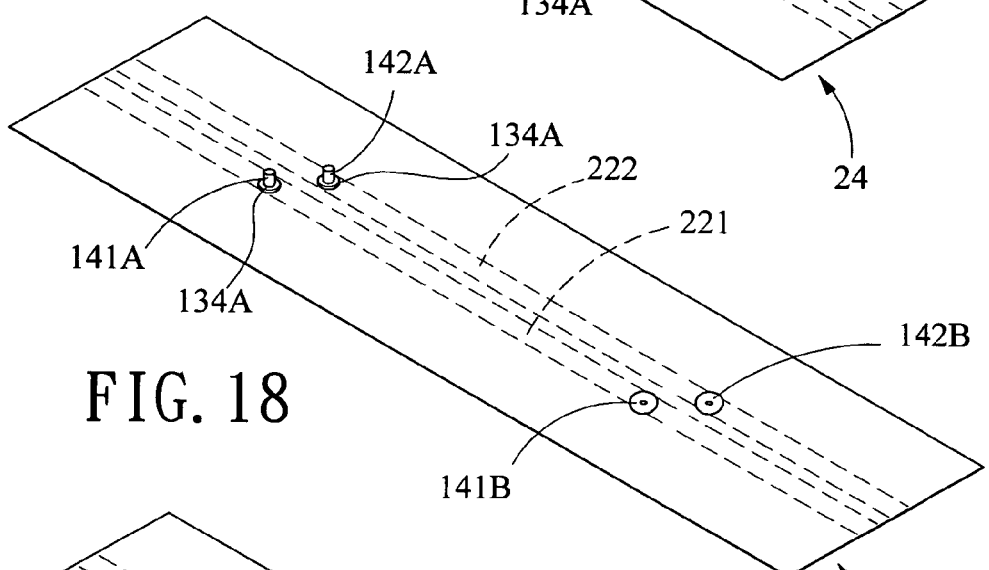
FIG. 18 is a view similar to FIG. 17, the reflective conductive belt being shown during rivet flattening.

Referring to FIGS. 16 to 18 in conjunction with FIG. 1, for mounting the lamp unit 1 on the belt unit 2, a punch machine 90 is used to punch a plurality of holes 241, 242 on the PVC film 211 and the PVC base belt 212 of the reflective conductive belt 24. Next, insert the rivets 141 and 142 into the holes 241, 242, the PVC film 211, and the PVC base belt 212 to electrically couple the lamp unit 1 and the belt unit 2 together. Next, flatten the shanks 141A, 142A of the rivets 141 and 142 projected from the reflective conductive belt 24 to form rivet fastening surfaces 141B, 142B respectively. As such, the lamp unit 1 is fastened at the belt unit 2 to form a reflector device 100. Further, as stated above the waterproof rings 134A are put on the shanks 141A, 142A. Hence, the waterproof rings 134A will be compressed by the rivet fastening surfaces 141B, 142B in the flattening process. As a result, the holes 241, 242 of the belt unit 2 will be completely blocked by the waterproof rings 134A. This has the benefits of forming a waterproof and airtight reflector device 100.

Figure 19:
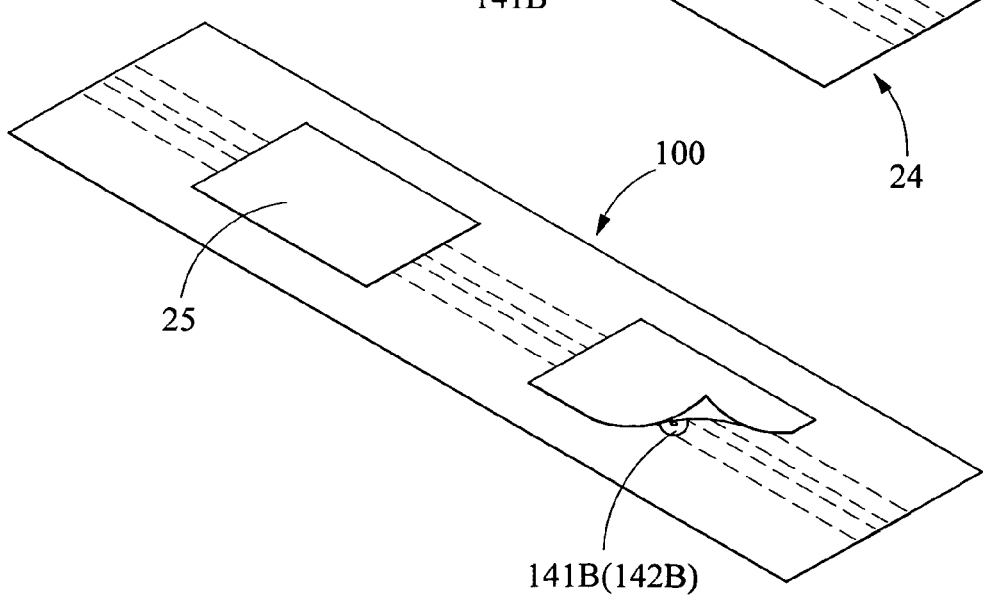
FIG. 19 is a view similar to FIG. 17, the reflector device being shown during waterproof sheets adhering.

Referring to FIGS. 19 and 20, waterproof sheets 25 can be then adhered to the rivet fastening surfaces 141B, 142B (FIG. 19). Alternatively, adhesive coating is performed on the rivet fastening surfaces 141B, 142B to form an adhesive layer 31 thereon (FIG. 20). Both can form a waterproof and airtight reflector device.

Referring to FIG. 21, ends 243 of the reflective conductive belt 24 can be inserted into waterproof sheaths 32. The waterproof sheath 32 comprises a soldering portion 322 fastened at the ends 243 of the reflective conductive belt 24 by means of a high-frequency or ultrasonic welder, and a stitching portion 321 adapted to stitch to a clothes when the reflector device 100 is attached to the clothes. The provision of the waterproof sheaths 32 at the ends of the reflective conductive belt 24 aims at providing a waterproof arrangement to the reflector device. Referring to FIGS. 22 and 22A, the waterproof arrangement at the ends of the reflective conductive belt 24 is carried out by folding the ends twice to form folded ends 244. Next, a high-frequency or ultrasonic welder is activated to fasten the ends 244 at portions 245, resulting in a waterproof reflector device.

Figure 23:
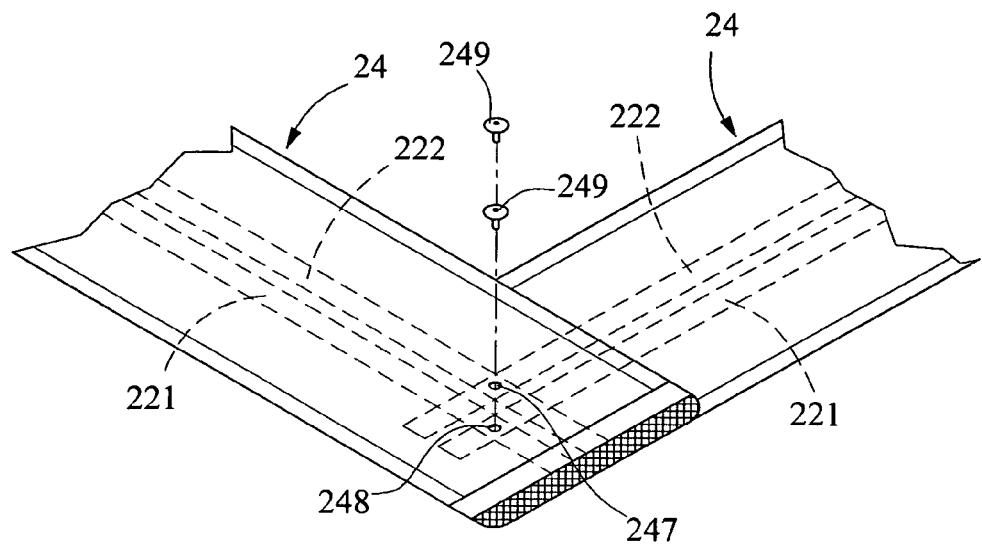
FIG. 23 is a view schematically showing electrical connection at ends of the reflective conductive belts according to one preferred embodiment of the invention.
Figure 24:
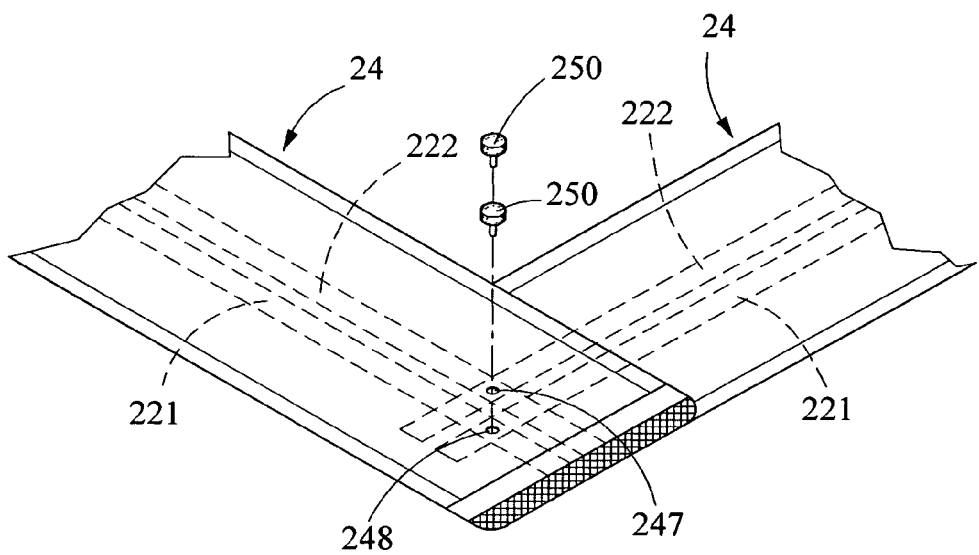
FIG. 24 is a view schematically showing electrical connection at ends of the reflective conductive belts according to another preferred embodiment of the invention.
Figure 25:
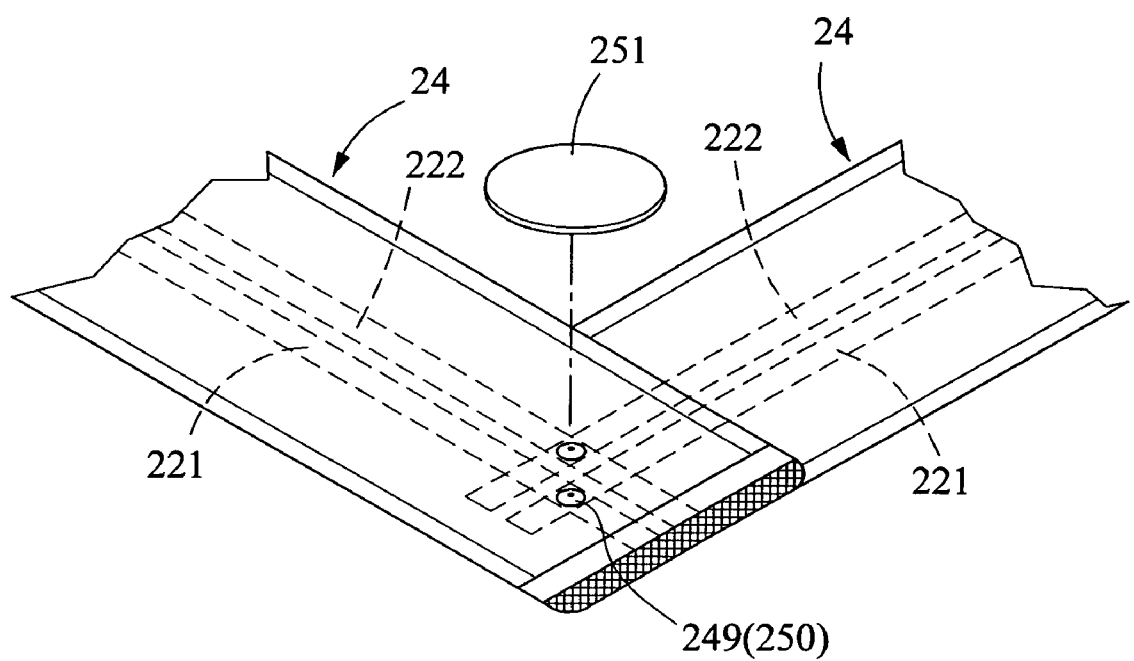
FIG. 25 is a view schematically showing a process of performing waterproof treatment on electrical connection at ends of the reflective conductive belts by mounting a waterproof pad thereon according to the invention.

Referring to FIGS. 23 to 25, apertures 247, 248 are formed at a joining portion of the metal conductors 221 and 222 of the reflective conductive belt 24. Next, rivets 249 (see FIG. 23) are used to insert in the apertures 247, 248 or plastic-cap metal nails (coating with plastic or rubber on cap portion of the nail) 250 (see FIG. 24) are used to insert in the apertures 247, 248 for fastening and electrically connecting to the reflective conductive belt 24. Finally, a waterproof pad 251 is adhered onto the rivets 249 or nails 250 at the joining portion. This completes the waterproof processing of the invention.

A plurality of holes 241, 242 can be punched on the belt unit 2 by the punching machine 90 depending on applications when a plurality of pairs of lamp units 1 are to be mounted on the belt unit 2. Also, a spacing between the holes 241 and 242 (see FIG. 16) of the same pair or different pair can be the same as or different from that between the holes 241 and 242 of another pair depending on actual applications. As such, the reflector devices can be produced in user end or downstream manufacturer by readily assembling the modular lamp units 1 and the belt units 2 in a mass production scale. Alternatively, a DIY (do-it-yourself) production in user end or downstream manufacturer is also made possible.

A process of manufacturing the reflector device of the invention comprises (a) punching at least one pair of holes 241, 242 on the belt unit 2 by a punching machine (FIG. 16); (b) placing the lamp unit 1 on the belt unit 2 (FIG. 1); (c) inserting the rivets 141 and 142 in the holes 241, 242 to electrically connect to two metal conductors 221, 222 (FIG. 17); (d) putting the waterproof rings 34A on the shanks of rivets 141 and 142 projected from the belt unit 2; (e) flattening the shanks of rivets 141 and 142 to form a plurality of rivet fastening surfaces 141B, 142B (FIG. 18) and fasten and electrically connect to the lamp unit 1; (FIG. 18); and (f) adhering waterproof sheets 25 to the rivet fastening surfaces 141B, 142B for completing the waterproof arrangement of the reflector device (FIG. 19).

The airtight and waterproof features of the invention enables the reflector device to employ in an environment requiring a highly safe operating standard such as an environment having gas or a room having inflammable articles stored therein. Moreover, no additional equipment is required in the manufacturing process. Thus, it can significantly reduce the manufacturing cost.

While the invention herein disclosed has been described by means of specific embodiments, numerous modifications and variations could be made thereto by those skilled in the art without departing from the scope and spirit of the invention set forth in the claims.

What is claimed is:

1. A reflector device, comprising
  a lamp unit comprising:
  a seat assembly having a base including two or more apertures;
  a rivet assembly in the seat assembly, the rivet assembly including two or more rivets each inserted through the apertures of the base and projected from an underside of the seat assembly and fastened thereat and a LED lamp mounted on the base, the LED lamp being electrically coupled to the rivet assembly; and
  a belt unit comprising an upper insulating layer and a lower insulating layer and a conductive layer sealed by the upper insulating layer and the lower insulating layer,
  wherein the base further comprises two or more contacts each having an opening in alignment with the corresponding aperture of the base and two or more electric wires each electrically interconnected the respective contact and the LED lamp;
  wherein the conductive layer comprises two or more conductors each being parallel and spaced extending in a same horizontal plane and the insulating layer comprises a plurality of sets of holes along the conductive layer so that the rivets are adapted to pass through the holes into the conductive layer to fasten and electrically connect the lamp and the belt units together.

2. The reflector device of claim 1, wherein a shank of each rivet is flattened to form a rivet fastening surface for mounting the lamp unit on the belt unit.

3. The reflector device of claim 2, further comprising a waterproof ring put on the shank of each rivet, and wherein the waterproof ring is compressed by the rivet fastening surface to block the hole after being flattened.

4. The reflector device of claim 2, further comprising a waterproof pad adhered onto the rivet.

5. The reflector device of claim 1, further comprising a waterproof layer on the rivet fastening surface.

6. The reflector device of claim 1, wherein the rivets of the rivet assembly and two leads of the LED lamp are interconnected together and integrally and fixedly formed with the seat assembly as a lamp unit.

7. The reflector device of claim 1, wherein the seat assembly comprises a support having side walls for forming a space, and an encapsulation in the space with the LED lamp and the rivet assembly being fastened and received therein.

8. The reflector device of claim 7, wherein the support further comprises two or more apertures with the rivet being inserted in.

9. The reflector device of claim 7, wherein the support further comprises a plurality of holes for bond injection.

10. The reflector device of claim 1, wherein the lamp unit further comprises a base having at least two apertures, each forming a contact thereon electrically connected with the LED lamp and each of the rivets of the rivet assembly being extended through the respective aperture and mounted thereon.

11. The reflector device of claim 10, wherein the base further comprises a plurality of holes used for bond injection.

12. The reflector device of claim 1, wherein the lamp unit further comprises a cap-like second base on the seat assembly.

13. The reflector device of claim 12, wherein the second base comprises a peripheral trough and the seat assembly comprises a peripheral ridge formed around an exterior of the seat assembly for facilitating a fastening of the trough of the second base onto the seat assembly.

14. The reflector device of claim 3, wherein the waterproof ring is disposed between the lamp and the belt units.

15. The reflector device of claim 1, wherein the insulating layer comprises a PVC film and a PVC base belt with the conductive layer being sealed between the PVC film and the PVC base belt.

16. The reflector device of claim 1, wherein the insulating layer further comprises a reflective belt.

17. The reflector device of claim 1, further comprising a plurality of waterproof sheaths each fastened at an end of the belt unit.

18. The reflector device of claim 1, wherein the end of the belt unit is folded and fastened.

19. The reflector device of claim 1, further comprising a plurality of second apertures through a joining portion of one belt unit and the other belt unit so as to permit rivets or plastic-cap metal nails to insert therein for fastening and electrically connecting the belt units together.

20. A belt unit of a reflector device for a continuously longitudinal strip of a lamp unit, comprising:
an insulating layer including a longitudinal strip of PVC film and a PVC base belt; and
a conductive layer including two or more longitudinal strips of conductors fastened, sealed, and disposed between the PVC film and the PVC base belt by pressing,
wherein the belt unit further comprises an adhesive coated on the belt unit, and a reflective belt adhered on the adhesive.

21. The belt unit of claim 20, further comprising a continuously longitudinal strip of reflective belt thereon.

22. The belt unit of claim 21, wherein the reflective belt is secured onto the belt unit by means of a high-frequency welding.

23. A method of manufacturing a reflector device, comprising the steps of:
(a) placing a punching machine in a belt unit;
(b) punching at least one set of holes on the belt unit;
(c) placing a lamp unit on the belt unit;
(d) inserting two or more rivets in the holes to electrically connect to two or more metal conductors in the belt unit; and
(e) flattening the shanks of the rivets projected from the belt unit to form two or more rivet fastening surfaces so as to fasten and electrically connect to the lamp unit.

24. The method of claim 23, further comprising the steps of putting two or more waterproof rings on the shanks of rivets and flattening the shank of each rivet to form the rivet fastening surface to compress the waterproof ring for blocking the hole prior to the step (e).

25. The method of claim 23, further comprising the step of adhering a waterproof pad onto each rivet fastening surface after the step (e).

26. The method of claim 23, further comprising the step of adhering a waterproof layer on each rivet fastening surface after the step (e).

* * * * *